(12) United States Patent
La Rosa et al.

(10) Patent No.: US 12,230,357 B2
(45) Date of Patent: Feb. 18, 2025

(54) DEVICE WITH SYNCHRONOUS OUTPUT

(71) Applicant: STMicroelectronics (Rousset) SAS, Rousset (FR)

(72) Inventors: Francesco La Rosa, Rousset (FR); Thierry Giovinazzi, Saint-Maximin (FR)

(73) Assignee: STMicroelectronics (Rousset) SAS, Rousset (FR)

(*) Notice: Subject to any disclaimer, the term of this patent is extended or adjusted under 35 U.S.C. 154(b) by 241 days.

(21) Appl. No.: 17/902,171

(22) Filed: Sep. 2, 2022

(65) Prior Publication Data

US 2023/0162764 A1 May 25, 2023

(30) Foreign Application Priority Data

Nov. 23, 2021 (FR) ...................... 2112398

(51) Int. Cl.
*G11C 7/10* (2006.01)
*G11C 7/22* (2006.01)
*H03K 5/135* (2006.01)
*H03K 5/1534* (2006.01)

(52) U.S. Cl.
CPC ............ *G11C 7/1066* (2013.01); *G11C 7/222* (2013.01); *H03K 5/135* (2013.01); *H03K 5/1534* (2013.01)

(58) Field of Classification Search
CPC .......... G01C 7/1066; G01C 7/00; G01C 7/10; G01C 7/222; H03K 5/135; H03K 5/1534
USPC ................. 327/263; 365/233, 233.1, 233.19
See application file for complete search history.

(56) References Cited

U.S. PATENT DOCUMENTS

| | | | |
|---|---|---|---|
| 9,041,446 B2* | 5/2015 | Blodgett | G11C 11/4076 327/158 |
| 9,135,966 B2* | 9/2015 | Iwamoto | G11C 7/1006 |
| 2005/0225365 A1 | 10/2005 | Wood | |
| 2018/0254774 A1 | 9/2018 | Thijssen et al. | |

* cited by examiner

*Primary Examiner* — Hai L Nguyen
(74) *Attorney, Agent, or Firm* — Slater Matsil, LLP

(57) ABSTRACT

The present description concerns an electronic device including: a first input configured to receive a clock signal, coupled by a first input buffer to a first circuit; and at least an output coupled by an output buffer to the first circuit, the output buffer being synchronized on first edges of the clock signal, wherein the first input buffer includes a data input coupled to the first input and is configured to maintain the value on its output constant whatever the value on its data input during a duration following each first edge of the clock signal.

20 Claims, 5 Drawing Sheets

DEVICE WITH SYNCHRONOUS OUTPUT

CROSS-REFERENCE TO RELATED APPLICATIONS

This application claims priority to French Application No. 2112398, filed on Nov. 23, 2021, which application is hereby incorporated by reference herein in its entirety.

TECHNICAL FIELD

The present disclosure generally relates to electronic devices, and in particular embodiments, to devices with synchronous outputs.

BACKGROUND

Among electronic devices, certain devices are devices with synchronous outputs. Synchronous outputs are used to designate outputs with a value only modified during a rising or falling edge of the clock signal. These generally are devices where the output values are binary values.

SUMMARY

An embodiment overcomes all or part of the disadvantages of known electronic devices with synchronous outputs.

An embodiment provides an electronic device including a first input, configured to receive a clock signal, coupled by a first input buffer to a first circuit; and at least one output coupled by an output buffer to the first circuit, the output buffer being synchronized on first edges of the clock signal, where the input buffer includes a data input coupled to the first input and is configured to maintain the value on its output constant whatever the value on its data input during a duration following each first edge of the clock signal.

Another embodiment provides a method of controlling an electronic device including a first input, configured to receive a clock signal, coupled by a first input buffer to a first circuit, and at least one output coupled by an output buffer to the first circuit, the output buffer being synchronized on first edges of the clock signal, the input buffer including a data input coupled to the first input, wherein the value on the output of the input buffer is maintained constant whatever the value on its data input for a duration following each first edge of the clock signal.

According to an embodiment, the device includes a second input, configured to receive a power supply voltage, coupled to a first circuit, and a third input configured to receive a reference voltage, coupled to the first circuit.

According to an embodiment, the device includes a fourth input, configured to receive an authorization voltage, coupled with a second input buffer to the first circuit.

According to an embodiment, the first circuit includes a memory, the values on the at least one output are binary values originating from the memory.

According to an embodiment, the device includes a plurality of outputs synchronized on the same clock signal, the outputs being configured to deliver distinct binary values.

According to an embodiment, the duration has a value smaller than the period of the clock signal.

According to an embodiment, the duration has a value smaller than half the period of the clock signal.

According to an embodiment, each input buffer includes a control input receiving a control signal taking a first value during the duration and a second value during the rest of each period of the clock signal.

According to an embodiment, the device includes a logic AND gate configured to receive on an input the control signal and on another input an output signal of the second input buffer, an output of the AND logic gate being coupled to the control input of the second input buffer.

According to an embodiment, the device includes a second circuit for generating the control signal, coupled with its input to the output of the first buffer.

According to an embodiment, the circuit for generating the control signal includes a delay circuit introducing a delay equal to duration T.

According to an embodiment, the circuit for generating the control signal includes a logic gate including an input coupled to the output of the first buffer, and another input coupled to the output of the first buffer by the delay circuit, the logic gate being an AND gate, in the case where the output buffers are synchronized on rising edges, or a NOR gate, in the case where the output buffers are synchronized on falling edges.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Like features have been designated by like references in the various figures. In particular, the structural or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially," and "in the order of" signify within 10% and preferably within 5%.

Figure 1:
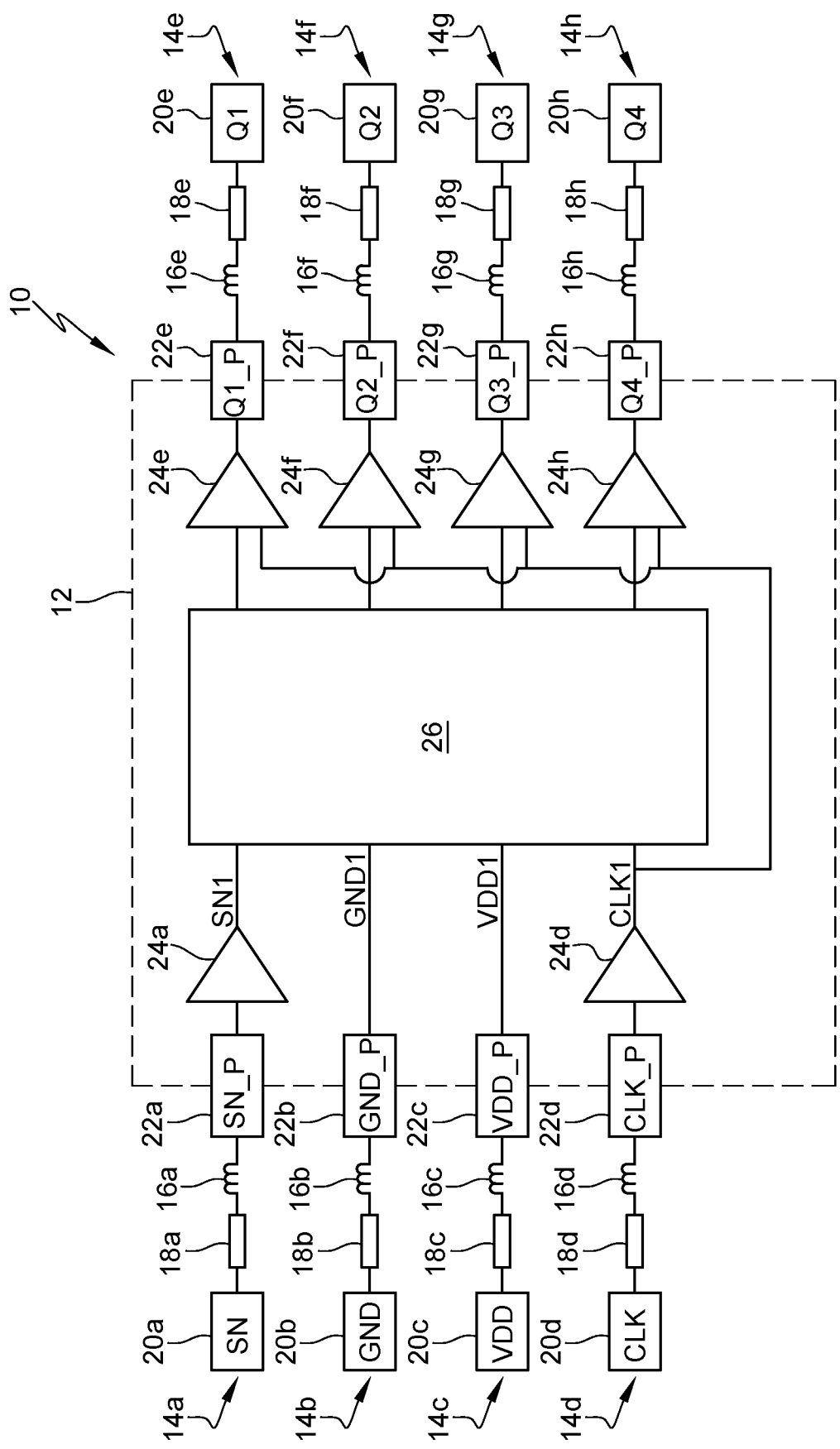
FIG. 1 schematically shows an example, of a device to which the embodiments described hereafter may apply.

FIG. 1 schematically shows an example, of a device 10 to which the embodiments described hereafter may apply. The device is a device with synchronous outputs. In embodiments, device 10 is a memory or a device including a memory. In embodiments, device 10 is a sequential access memory. In embodiments, device 10 is a synchronous memory. In embodiments, device 10 is an integrated circuit.

Device 10 includes a chip 12. Device 10 includes pins 14 coupling chip 12 to circuits or devices external to the chip. In the example, of FIG. 1, device 10 includes eight pins 14a, 14b, 14c, 14d, 14e, 14f, 14g, and 14h. Each pin 14 is represented by an inductive element 16, a resistor 18, and a block 20 corresponding to the end of the pin.

Each pin enables to electrically couple a contact pad 22 of chip 12 to a voltage source (input pads) or a node of application of a voltage generated by the chip (output pads). In other words, each pin enables to supply chip 12 with a voltage originating from an external circuit or enables the chip to supply a voltage to an external circuit.

Each end of a pin is coupled to a pad 22 by resistor 18 and inductive element 16 coupled in series. Inductive elements 16 and resistors 18 are, for example, theoretical elements and, for example, represent the characteristics of the pin. In practice, the pin is, for example, formed of a conductive branch, for example, a metal branch.

Device 10, for example, includes four input pins 14a, 14b, 14c, and 14d. Device 10, for example, includes four output pins 14e, 14f, 14g, and 14h.

Input pin 14a is coupled, by its end 20a, to an external node of application of a voltage SN. The end 20a is coupled, by the resistor 18a and the inductive element 16a of this pin, in other words, by the metal branch, to a contact pad 22a of chip 12. A voltage SN-P is thus applied to the pad 22a by pin 14a.

Signal SN is, for example, a selection or authorization signal, preferably binary. In other words, signal SN is, for example, a binary signal taking a first value giving the device the instruction to be in operation and a second value giving the device the instruction to stop operating.

Input pin 14b is coupled, by its end 20b to an external node of application of a reference voltage GND, for example, a ground. The end 20b is coupled, by the resistor 18b and the inductive element 10 of this pin, in other words, by the metal branch, to a contact pad 22b of chip 12. A voltage GND-P is thus applied to the pad 22b by pin 14b.

Input pin 14c is coupled, by its end 20c, to an external node of application of a power supply voltage VDD of chip 12. The end 20c is coupled, by the resistor 18c and the inductive element 16c of this pin, in other words, by the metal branch, to a contact pad 22c of chip 12. A voltage VDD-P is thus applied to the pad 22c by pin 14c.

Input pin 14d is coupled by its end god to an outer node of application of a clock signal CLK. The end god is coupled, by the resistor 18d and the inductance 16d of this pin, in other words, by the metal branch, to a contact pad 22d of chip 12. A voltage CLK-P is thus applied to the pad 22d by pin 14d.

Chip 12 includes a contact pad 22e having a voltage Q1-P applied thereto by chip 12. Pad 22 is coupled to the end of pin 14e by the resistor 18e and the inductance 16e of this pin, in other words, by the metal branch. Pin 14e thus delivers, on a node of a circuit external to the chip to which the end is electrically coupled, a voltage Q1.

Chip 12 includes a contact pad 22f having a voltage Q2-P applied thereto by chip 12. Pad 22f is coupled to the end of pin 14f by the resistor 18f and the inductive element 16f of this pin, in other words, by the metal branch. Pin 14f thus delivers, on a node of a circuit external to the chip to which the end is electrically coupled, a voltage Q2.

Chip 12 includes a contact pad 22g having a voltage Q3-P applied thereto by chip 12. Pad 22g is coupled to the end of pin 14g by the resistor 18g and the inductive element 16g of this pin, in other words, by the metal branch. Pin 14g thus delivers, on a node of a circuit external to the chip to which the end is electrically coupled, a voltage Q3.

Chip 12 includes a contact pad 22h having a voltage Q4-P applied thereto by chip 12. Pad 22h is coupled to the end of pin 14h by the resistor 18h and the inductive element 16h of this pin, in other words, by the metal branch. Pin 14h thus delivers, on a node of a circuit external to the chip to which the end is electrically coupled, a voltage Q4.

Output voltages Q1, Q2, Q3, and Q4, for example, correspond to binary values. Output voltages Q1, Q2, Q3, and Q4, for example, correspond to data read from a memory of chip 12. Device 10, for example, operates with a parallel protocol, that is, the different outputs may simultaneously output different data.

Chip 12 includes input buffer amplifiers, or input buffers, 24a and 24d coupled to input pads 22a and 22d. Chip 12 further includes output buffer amplifiers, or output buffers, 24e to 24h coupled to output pads 22e to 22h. In the example of FIG. 1, chip 10 thus includes six buffers 24a, 24d, 24e, 24f, 24g, and 24h. Chip 12 further includes circuits having various functions, represented by a block 26. Block 26, for example, includes logic circuits. Circuit 26, for example, includes a memory. Circuit 26, for example, includes data processing circuits.

Pads 22a and 22d to 22h are coupled to circuit 26 by buffers 24a and 24d to 24h. In other words, an input terminal of buffer 24a is coupled, preferably connected, to pad 22a and an output terminal of buffer 24a is coupled, preferably connected, to circuit 26. An input terminal of buffer 24d is coupled, preferably connected, to pad 22d and an output terminal of buffer 24d is coupled, preferably connected, to circuit 26. An output terminal of buffer 24e is coupled, preferably connected, to pad 22e and an input terminal of buffer 24e, or data input, is coupled, preferably connected, to circuit 26. An output terminal of buffer 24f is coupled, preferably connected, to pad 22f and an input terminal of buffer 24f is coupled, preferably connected, to circuit 26. An output terminal of buffer 24g is coupled, preferably connected, to pad 22g and an input terminal of buffer 24g is coupled, preferably connected, to circuit 26. An output terminal of buffer 24h is coupled, preferably connected, to pad 22h and an input terminal of buffer 24h is coupled, preferably connected, to circuit 26. Pads 22b and 22c are preferably not coupled to circuit 26 by buffers, for example, pads 22b and 22c are connected to circuit 26.

A voltage SN1 is applied by buffer 24a on its output. Voltage SN1 thus is the voltage delivered to circuit 26. A voltage GND1 is delivered to circuit 26. A voltage VDD1 is delivered to circuit 26. A voltage CLK1 is applied by buffer 24d on its output. Voltage CLK1 thus is the voltage delivered to circuit 26.

Output buffers 24e, 24f, 24g, and 24h each include an input having a clock signal, preferably voltage CLK1, delivered thereon. The inputs are, for example, all coupled, preferably connected, to the output of buffer 24d. Thus, at each edge of the same type, for example, at each falling edge, of clock signal CLK1, the binary values on pads 22e, 22f, 22g, and 22h can change. The binary values on pads 22e, 22f, 22g, and 22h are not modified in the absence of an edge of the clock signal or clock edge.

Figure 2:
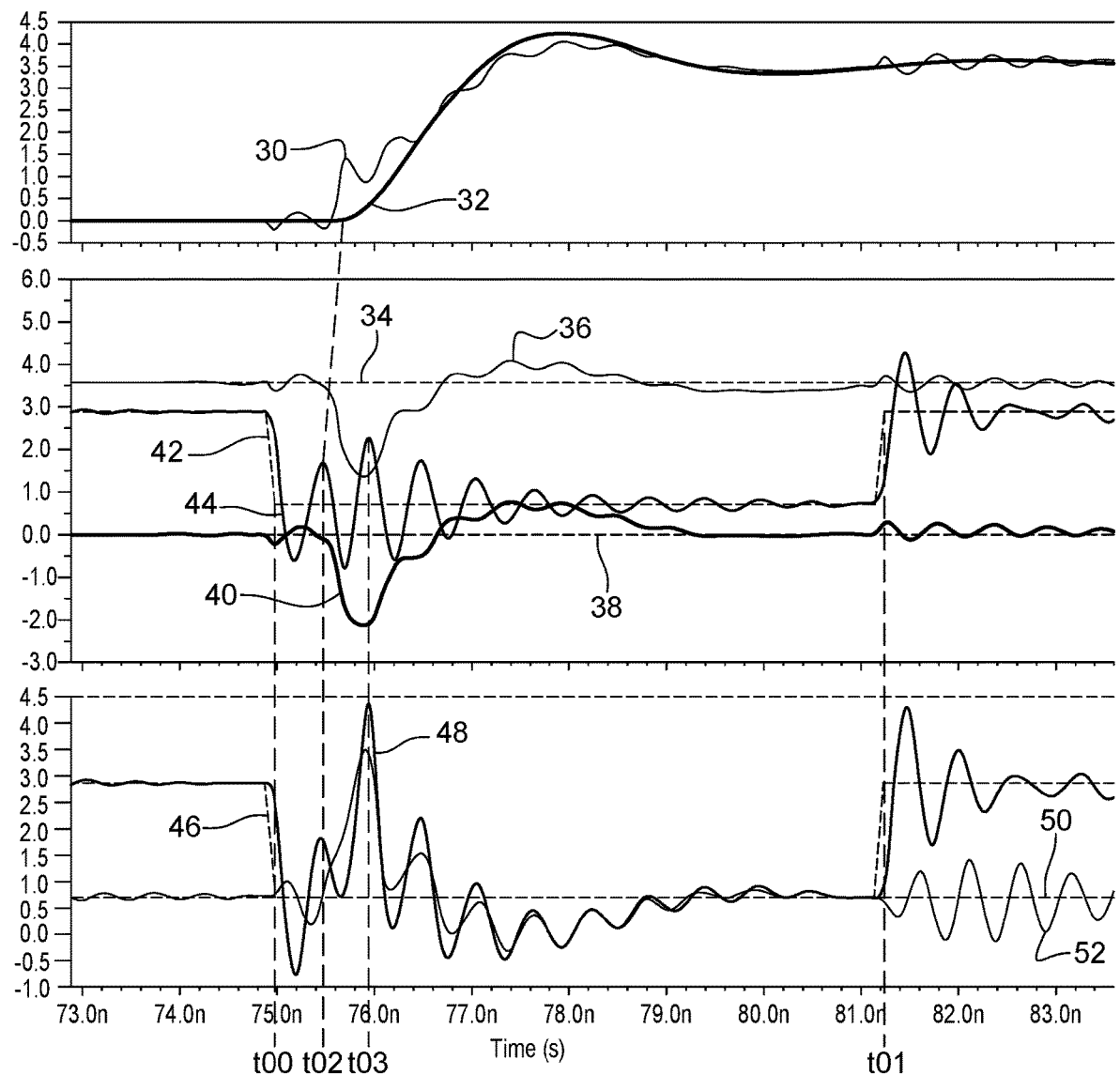
FIG. 2 illustrates the operation of the device of FIG. 1.

FIG. 2 illustrates the operation of FIG. 1. FIG. 2 includes timing diagrams illustrating: by a curve 30, the voltage on one of output pads 22, for example, pad 22h, that is, voltage Q4-P; by a curve 32, the voltage at the end of the pin corresponding to the pad, for example, pin 14h, that is, voltage Q4; by a curve 34, the voltage on end 20c, that is, power supply voltage VDD; by a curve 36, the voltage on pad 22c, that is, voltage VDD-P, substantially equal to voltage VDD1, referenced to voltage GND; by a curve 38, the voltage on end 20b, that is, reference voltage GND; by a curve 40, the voltage on pad 22b, that is, voltage GND-P, substantially equal to voltage GND1, referenced to voltage GND; by a curve 42, the voltage on end god, that is, clock signal CLK, referenced to voltage GND; by a curve 44, the voltage on pad 22d, that is, clock signal CLK-P, referenced to voltage GND; by a curve 46, clock signal CLK, referenced to reference voltage GND, that is, the difference between curves 42 and 38; by a curve 48, clock signal CLK-P, referenced to reference voltage GND-P, that is, the difference between curves 44 and 40; by a curve 50, voltage SN, referenced to reference voltage GND; by a curve 48, voltage SN-P, referenced to voltage GND-P.

FIG. 2 illustrates a falling edge and a rising edge of the clock signal CLK. Thus, curves 42 and 46 fall from a high value to a low value at a time too and rise from the low value to the high value at a time t01 subsequent to time t00. Voltage SN keeps a low value indicating the memory operation.

After the falling edge, the binary output values represented by curves 30 and 32 rise from a low value to a high value. More precisely, a capacitive element, not shown in FIG. 1, for example, a parasitic capacitive element coupled to the end 20 of the considered pin, is then charged to hold the high value. When the binary value rises from the low value to the high value, the capacitive element is charged and when the binary value falls from the high value to the low value, the capacitive element is discharged. Thus, at each change of binary value, a current flows through the resistor 16 and the inductance 18 of the pin. The fast transition from a zero current to a current of high absolute value in the components generates significant noise. In particular, this noise results in significant variations on input pads 22a, 22b, 22c, and 22d, the pads being coupled by parasitic capacitive elements, not shown in FIG. 1.

It is thus possible to observe that voltages SN-P, CLK-P, VDD-P, and GND-P do not correspond to voltages SN, CLK, VDD, and GND. Thus, the voltages SM, GND1, VDD1, and CLK1 obtained at the outputs of the input buffers exhibit the same variations. At time t2 of binary value switching on the output pad, that is, when curve 32 increases to reach the high value, voltages SN-P, CLK-P, VDD-P, and GND-P vary. In particular, voltages GND-P and VDD-P decrease.

Voltages GND-P and VDD-P vary substantially identically. Thus, the power supply voltage received by circuit 26, that is, the difference between voltages GND-P and VDD-P, does not significantly vary. However, the clock signal (curve 48) seen by chip 26 and used by output buffers 24e, 24f, 24g, and 24h, that is, the difference between voltages CLK1 and GND1, strongly varies with respect to the supplied clock signal CLK.

At a time t3, subsequent to time t2 and preceding time t1, the value of voltage CLK-P is greater than the value of voltage CLK and the value of voltage GND-P is smaller than voltage GND. Thus, the clock signal seen by chip 26 and used by output buffers 24e, 24f, 24g, and 24h (curve 48) has a value greater than the low value of clock signal CLK. The difference may have a value greater than the high value of clock signal CLK. Thus, circuit 26 and the output buffers receive a rising edge and a falling edge of the clock signal, which should not be present. The rising and falling edges may cause a change in the output value, which may then have a false value.

Figure 3:
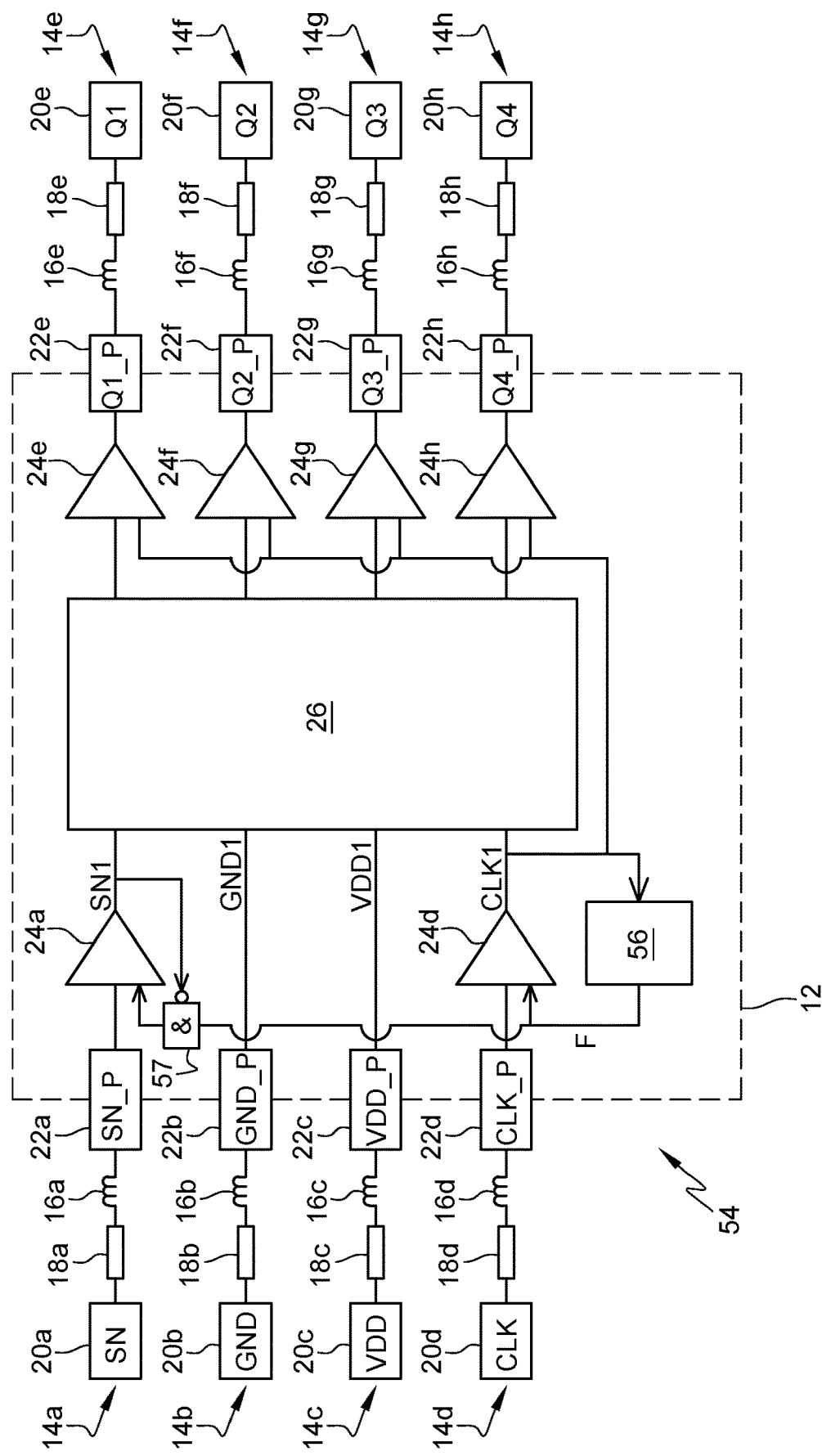
FIG. 3 shows an embodiment of a synchronous electronic device.

FIG. 3 shows an embodiment of a synchronous electronic device 54. Device 54 is, for example, a memory or a device including a memory. Device 54 is, for example, a sequential access memory. Device 54 is, for example, a synchronous memory.

Device 54 includes the elements of device 10. In other words, device 54 includes chip 12 and pins 14 such as previously described. More precisely, device 54 includes, in chip 12, circuit 26, buffers 24a and 24d to 24h, and pads 22a to 22h and includes, in pins 14a to 14h, resistors 18a to 18h, inductive elements 16a to 16h, and ends 20a to 20h. Voltages SN, GND, VDD, CLK, Q1, Q2, Q3, and Q4 are respectively applied to ends 20a to 20h. Similarly, voltages SN-P, GND-P, VDD-P, CLK-P, Q1-P, Q2-P, Q3-P, and Q4-P are respectively present on pads 22a to 22h. Input buffers 24a and 24d supply, on their output, signals SM and CLK1.

Input buffers 24a and 24d are, for example, Schmitt buffers. In other words, the input buffers, for example, include a Schmitt inverter. The input buffers, that is, in FIG. 3, buffers 24a and 24d, are configured to maintain at their output, for a duration T of each period of clock signal CLK, the output value of the starting time of duration T, whatever the value on the pad 22 coupled to the buffer. Duration T is shorter than the period of the clock signal. Duration T is preferably shorter than half the period of the clock signal. Duration T occurs after each edge of the type of edge having output buffers 24e to 24h synchronized thereon. In other words, if output buffers 24e to 24h are synchronized on falling edges, duration T is located between each falling edge and the next rising edge, that is, when the clock signal has a low value. If output buffers 24e to 24h are synchronized on rising edges, duration T is located between each rising edge and the next falling edge, that is, when the clock signal CLK has a high value.

Duration T is preferably identical for input buffers 24a and 24d. In other words, the length of duration T is the same for each input buffer. Further, duration T occurs at the same time for all the input buffers.

For example, input buffers 24a and 24d each include a control input configured to receive a voltage F representative of duration T. Voltage F is, for example, a binary value. Voltage F, for example, takes a high value for duration T and a low value outside of duration T. Thus, when one of the input buffers receives voltage F having the high value, the value of the output of the input buffer is held at its value during the rising edge of voltage F.

Device 54, preferably chip 12, includes a circuit 56 for generating voltage F. Circuit 56 includes an input coupled, preferably connected, to the output of buffer 24d, that is, the buffer supplying clock signal CLK1 to circuit 26. Circuit 56 thus receives, as an input, clock signal CLK1. Circuit 56 outputs voltage F.

In the example, of FIG. 3, chip 12 includes a single circuit 56. Circuit 56 then supplies the same voltage F to all the input buffers. Preferably, each input buffer 24a and 24d includes a control input coupled, preferably connected, to an output of circuit 56.

Device 54 further includes an AND logic gate (&) 57. Logic gate 57 receives as an input signal F and the complementary value of signal SN1. Logic gate 57 supplies the signal for controlling buffer 24a. In other words, logic gate 57 includes an input coupled, preferably connected, to the output of circuit 56 having signal F generated thereon. Logic gate 57 includes another inverting input coupled, preferably connected, to the output of buffer 24*a*. Logic gate 57 includes an output coupled, preferably connected, to the control input of buffer 24*a*.

Figure 5:
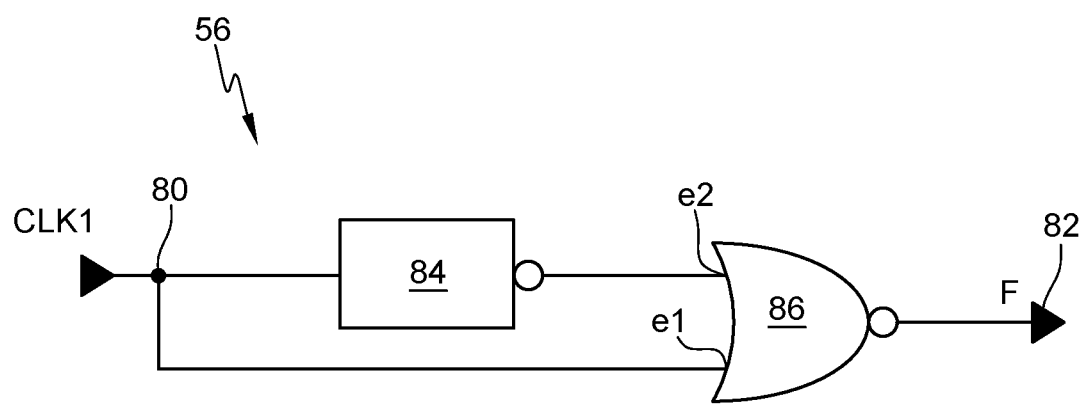
FIG. 5 shows a portion of the embodiment of FIG. 3.
Figure 6:
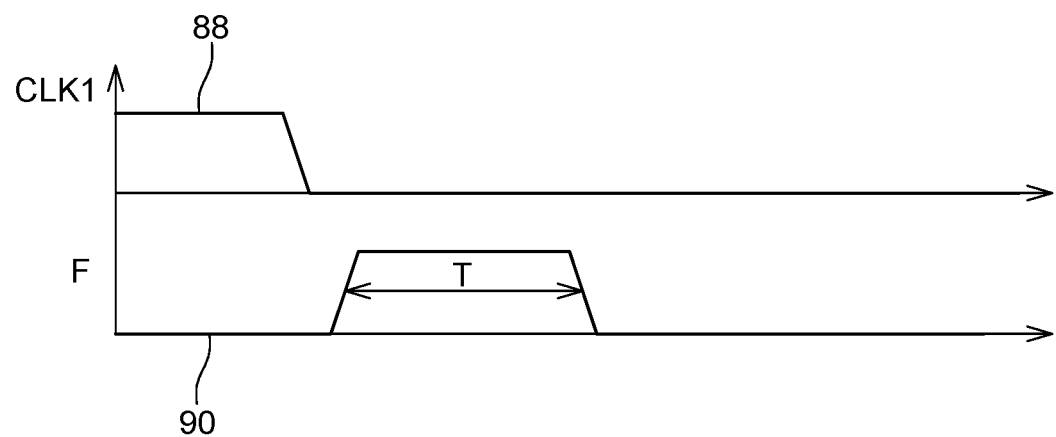
FIG. 6 illustrates the operation of the circuit of FIG. 5.

An example, of circuit 56 is described in further detail in relation with FIGS. 5 and 6.

Figure 4:
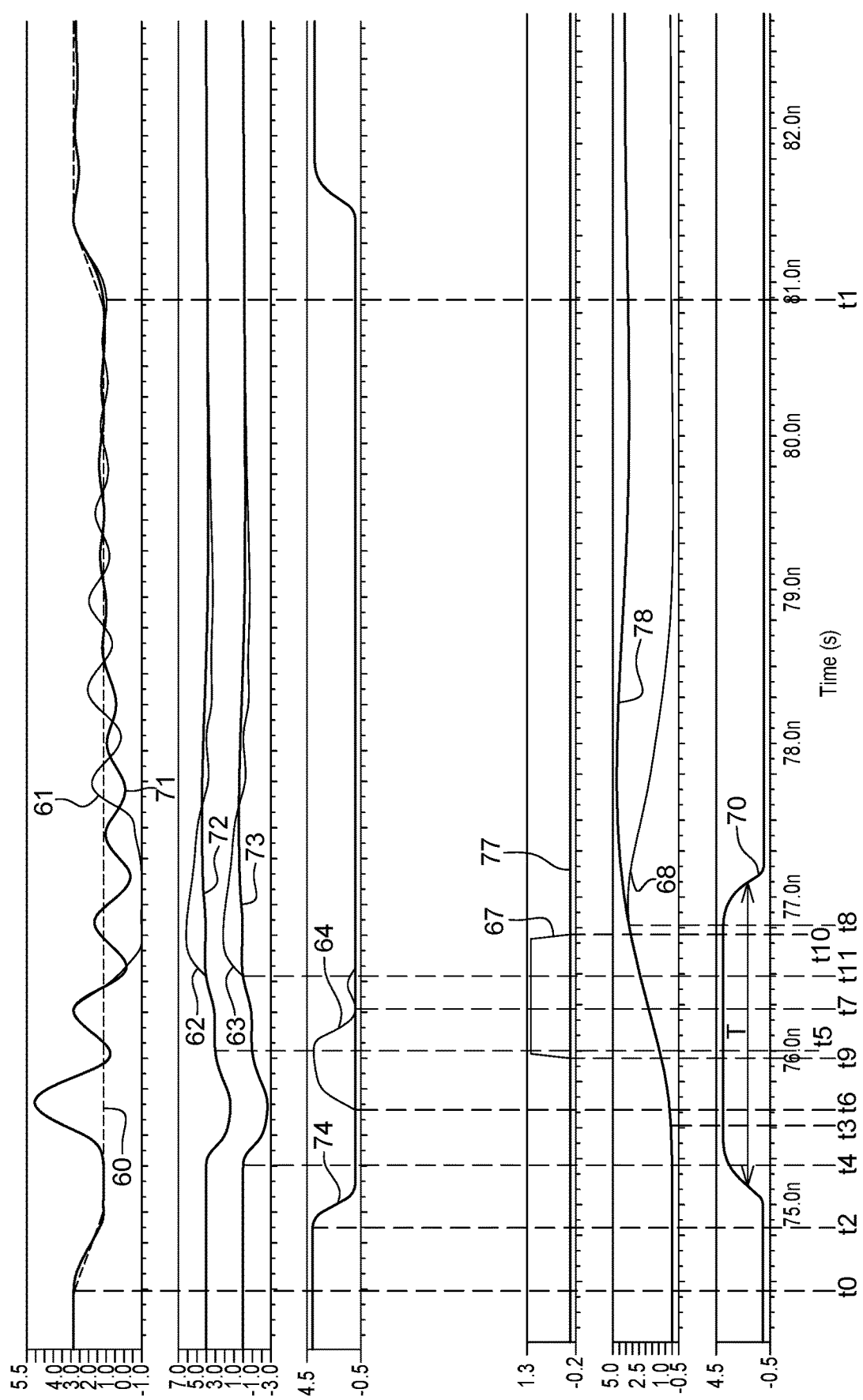
FIG. 4 illustrates the operation of the embodiment of FIG. 3.

FIG. 4 illustrates the operation of the embodiment of FIG. 3. FIG. 4 includes timing diagrams comparing a plurality of voltages in the device 10 of FIG. 1 and the device 54 of FIG. 3. More precisely, FIG. 4 includes timing diagrams illustrating: voltage CLK, referenced to voltage GND-P, by a curve 60; the voltage CLK-P, referenced to voltage GND, of circuit 10, by a curve 61 the voltage VDD-P, substantially equal to voltage VDD1, referenced to voltage GND, of circuit 10, by a curve 62; the voltage GND-P, substantially equal to voltage GND1, referenced to voltage GND, of circuit 10, by a curve 63; the voltage CLK1, referenced to voltage GND-P, of circuit 10, obtained at the output of buffer 24*d* and delivered to output buffers 24*e* to 24*h*, by a curve 64; the voltage SN1, referenced to voltage GND-P, of circuit 10, obtained at the output of buffer 24*a*, by a curve 67; an output voltage on a pad 22, for example, voltage Q1-P, referenced to voltage GND-P, of circuit 10, by a curve 68; the voltage F of circuit 54, by a curve 70; the voltage CLK-P, referenced to voltage GND-P, of circuit 54, by a curve 71; the voltage VDD-P, substantially equal to voltage VDD1, referenced to voltage GND, of circuit 54, by a curve 72; the voltage GND-P, substantially equal to voltage GND1, referenced to voltage GND, of circuit 54, by a curve 73; the voltage CLK1, referenced to voltage GND-P, of circuit 54, obtained at the output of buffer 24*d* and delivered to output buffers 24*e* to 24*h*, by a curve 74; the voltage SN1, referenced to voltage GND-P, of circuit 54, obtained at the output of buffer 24*a*, by a curve 77; and an output voltage on a pad 22, for example, the voltage Q1-P, referenced to voltage GND-P, of circuit 54, by a curve 78.

FIG. 4 illustrates a falling edge and a rising edge of voltage CLK, that is, of curve 60. FIG. 4 thus illustrates the switching, at a time t0, from the high value to the low value of voltage CLK. FIG. 4 further illustrates the half-period of voltage CLK during which voltage CLK has the low value, between time t0 and a time t1 subsequent to time t0. FIG. 4 also illustrates the switching from the low value to the high value of voltage CLK at time t1.

In the case of the device 10 of FIG. 1, at a time t2 between times t0 and t1, voltage CLK1 (curve 64), delivered to the output buffers, falls from a high value to a low value. In this example, the output value supplied by circuit 26 on the input of buffer 24*e* has risen from a low value to a high value before time t2. Thus, the falling edge of voltage CLK1 causes the rising, at a time t3, of voltage Q1-P from a low value to a high value.

As previously described in relation with FIG. 2, the change of value of the current in an output pin, for example, pin 14*e*, allowing the change of output value, causes variations in voltages CLK-P (curve 61), VDD-P (curve 62), and GND-P (curve 63). Thus, it can be observed that from a time t4, between times t2 and t3, voltages CLK-P, VDD-P, and GND-P vary. In particular, voltages VDD-P and GND-P decrease and then increase to recover their original value between time t4 and a time t5, subsequent to time t3.

Accordingly, as previously discussed, voltage CLK-P referenced to voltage GND-P (curve 61) varies, in particular between times t4 and t5 when voltage CLK-P may take a value greater than the high value of the clock signal. Thus, between a time t6, subsequent to time t4 and a time t7, subsequent to time t5, the clock signal CLK1 delivered to buffer 24*e* (curve 64) takes a high value, caused by the high value of voltage CLK-P between times t4 and t5.

Buffer 24*e* thus receives a falling edge of the clock signal that it should not have received. In the example, of FIG. 4, the voltage on the data input of buffer 24*e* has changed value between time t0 and time t7. Thus, the falling edge of curve 64 at time t7 causes a change of value of output voltage Q1-P. It can indeed be observed that voltage Q1-P starts decreasing at a time t8, subsequent to time t7, to reach the low value instead of keeping on increasing to reach the high value. The value supplied by pin 14*e* thus is the low value instead of the high value. The data delivered by pin 14*e* are therefore false.

The change of output value at time t8, that is, the change of value of the current in pin 14*e*, causes, as between times t4 and t5, a variation of voltages CLK-P (curve 61), VDD-P (curve 62), and GND-P (curve 63). The variation occurs in this case in the reverse direction. Thus, from a time t11 subsequent to time t7, voltage CLK-P takes a value smaller than the low value and voltages VDD-P and GND-P take values greater than the high value.

Similarly, voltage SN-P referenced to voltage GND-P (not shown) varies and may take a value greater than the high value of voltage SN. Thus, between a time t9, subsequent to time t4, and a time t10, subsequent to time t5, the voltage SM supplied to circuit 26 (curve 67) takes a high value, caused by the high value of voltage CLK-P between times t4 and t5.

In the case of device 54, the voltage CLK-P (curve 74) supplied to the output buffers falls, at time t2, from a high value to a low value, as in the case of device 10. In this example, the output value supplied by circuit 26 on the input of buffer 24*e* has risen from a low value to a high value before time t2. Thus, the falling edge of voltage CLK1 (curve 74) delivered to buffer 24*e* causes, at a time t3, the increase of voltage Q1-P (curve 78) to rise from a low value to a high value.

As previously described in relation with FIG. 2, the change of value of the current in pin 14*e*, allowing the change of output value Q1-P, causes variations in voltages CLK-P (curve 71), VDD-P (curve 72), and GND-P (curve 73). Thus, it can be observed that from time t4, voltages CLK-P, VDD-P, and GND-P vary as in the case of device 10. In particular, voltages VDD-P and GND-P decrease and then increase to recover their original value between time t4 and a time t5, subsequent to time t3.

Accordingly, as previously discussed, voltage CLK-P referenced to voltage GND-P (curve 61) varies, in particular between times t4 and t5 when voltage CLK-P may take a value greater than the high value of the clock signal.

The falling edge at time t2 also causes the rising from a low value to a high value of voltage F (curve 70). Voltage F is held at the high value for a duration T. During this duration T, that is, as long as voltage F has the high value, the outputs of input buffers 24*a* to 24*d* do not change value. Thus, voltages CLK1 (curve 74) and SN1 (curve 77) keep a low value as long as voltage F has the high value. More precisely, voltage CLK1 (curve 74), respectively voltage SN1 (curve 77), does not exhibit the transition to the high value between times t6 and t7, respectively between times t9 and t10, which is present in the case of device 10. The absence of the falling edge of time t7 ensures for output value Q1-P to keep the correct value.

FIG. 5 shows a portion of the embodiment of FIG. 3. More precisely, FIG. 5 shows a mode of implementation of the circuit 56 of FIG. 3.

Circuit 56 includes an input node 80 and an output node 82. Input node 80 is coupled, preferably connected, to the output of buffer 24d. The output node is coupled, preferably connected, to an input of at least one input buffer 24a to 24d, preferably to an input of each input buffer 24a to 24d. Voltage F is supplied on output node 82.

Circuit 56 includes an inverter circuit 84. Circuit 84 is configured to introduce a delay equal to duration T. Circuit 84 includes an input coupled, preferably connected, to node 80. Preferably, circuit 84 is configured so that the value of the delay introduced by circuit 84 is substantially constant during the operation of circuit 56. Preferably, the value of the delay introduced by circuit 84 is independent from power supply voltage and temperature variations.

Circuit 56 includes a logic NOR gate 86. Gate 86 includes an input e1 coupled, preferably connected, to an output of circuit 84 and another input e2 coupled, preferably connected, to node 80. An output of gate 86 is coupled, preferably connected, to node 82. Gate 86 preferably outputs voltage F.

As a variant, gate 86 may be an XNOR gate.

FIG. 6 illustrates the operation of the circuit of FIG. 5. FIG. 6 includes a timing diagram illustrating the clock signal CLK1 of circuit 26, that is, the output voltage of buffer 24d, by a curve 88 and illustrating voltage F by a curve 90.

FIG. 6 illustrates a falling edge of clock signal CLK1. Before the falling edge, voltage CLK1 has a high value corresponding to a binary "1". The gate 86 of circuit 56 thus receives on input e1 the "1" of voltage CLK1 and a binary "0" supplied by circuit 84 on input e2. Voltage F thus has a low value corresponding to a binary "0".

After the falling edge, voltage CLK1 takes a low value. Gate 86 thus receives on input e1 a binary "0" but keeps on, for a duration T, receiving on input e2 a binary "0". During the duration T following the falling edge, voltage F thus has a high value, corresponding to a binary After duration T, the output value of circuit 84, that is, the value on input e2, takes binary value "1" and voltage F thus has a low value corresponding to a binary "0".

Thus, voltage F takes a value indicating to input buffers 24a to 24d to maintain their output value at the value preceding the beginning of duration T. In the example of FIG. 6, the value is a binary value "1". In another embodiment, it might be another value.

An advantage of the described embodiments is that the noise generated by the switching of the output values does not impact the operation of circuit 26 and the output values.

Various embodiments and variants have been described. Those skilled in the art will understand that certain features of these various embodiments and variants may be combined, and other variants will occur to those skilled in the art. In particular, although in the different described embodiments, the output buffers are synchronized on the falling edges of their clock signal, the embodiments may easily be adapted to devices where the output buffers are synchronized on rising edges. Durations T are then located after each rising edge, that is, between each rising edge and the next falling edge. The circuits for generating the control voltage F, F1, F2 of the input buffers can then be modified., for example, the NOR gate is, for example, replaced with an AND gate.

Further, the described devices include four outputs, that is, four pins 14e to 14h having output values generated thereon, and thus four output buffers. More generally, the devices according to the embodiments may include any number of outputs, that is, at least one output. The embodiments are, however, particularly advantageous for devices including a plurality of parallel outputs, since the noise caused by the changes of output value is then more significant.

Similarly, the devices according to the embodiments may include any number of inputs, that is, any number of input pins 14 coupled to circuit 26 by a buffer. In the described embodiments, all the input buffers are controlled by a voltage F like the buffers 24a to 24d described in relation with FIGS. 3 to 7. More generally, certain input buffers may not be.

Finally, the practical implementation of the described embodiments and variations is within the abilities of those skilled in the art based on the functional indications given hereabove.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. An electronic device, comprising:
a first input configured to receive a clock signal;
a first input buffer having a data input, a control input, and an output buffer, the data input coupled to the first input, the control input configured to receive a first control signal indicating to the first input buffer to maintain a constant value for a first output voltage at the output buffer of the first input buffer for a first duration after each edge of the clock signal, the first duration being a subset of a period of the clock signal;
a first circuit having a clock input coupled to the output buffer and configured to receive the first output voltage; and
a first output buffer having a first input coupled to an output of the first circuit and a second input coupled to the output buffer, a second output voltage at the first output buffer changing value based on the first output voltage and synchronized on a first edge of the clock signal.

2. The electronic device of claim 1, further comprising:
a second input configured to receive a power supply voltage, the second input coupled to the first circuit; and
a third input configured to receive a reference voltage, the third input coupled to the first circuit.

3. The electronic device of claim 2, further comprising a fourth input configured to receive an authorization voltage, the fourth input coupled to the first circuit via a second input buffer having a data input and a control input, the control input configured to receive a second control signal.

4. The electronic device of claim 3, wherein each of the first control signal and the second control signal have a first value during the first duration and a second value during a remaining duration of the period of the clock signal.

5. The electronic device of claim 4, further comprising a second circuit having an input coupled to the output buffer of the first input buffer, the second circuit configured to generate the first control signal and the second control signal.

6. The electronic device of claim 5, wherein the second circuit comprises a delay circuit configured to generate a delay equal to the first duration.

7. The electronic device of claim 6, wherein the second circuit comprises a logic gate having a first input coupled to the output buffer of the first input buffer, and a second input coupled to the output buffer of the first input buffer via the delay circuit, the logic gate being an AND gate in response to the first output buffer being synchronized on rising edges or a NOR gate in response to the first output buffer being synchronized on falling edges.

8. The electronic device of claim 5, further comprising an AND logic gate having an output coupled to the control input of the second input buffer, the AND logic gate configured to:
receive, at a first input, the first control signal; and
receive, at a second input, an output signal of the second input buffer.

9. The electronic device of claim 1, further comprising a memory storage configured to have a binary value output.

10. The electronic device of claim 1, further comprising a plurality of outputs, each output synchronized on the same clock signal and configured to deliver distinct binary values.

11. The electronic device of claim 1, wherein a value of the first duration is smaller than half the period of the clock signal.

12. A method for controlling an electronic device, the method comprising:
receiving, by a first input of the electronic device, a clock signal, the first input coupled to a first circuit via a first input buffer;
maintaining, by the first input buffer, a constant output voltage based on a control signal received by the first input buffer for a first duration after each edge of the clock signal, the first duration being a subset of a period of the clock signal; and
synchronizing a first output of the electronic device on a first edge of the clock signal, the first output coupled to the first circuit via a first output buffer.

13. The method of claim 12, further comprising:
receiving, by a second input of the electronic device, a power supply voltage, the second input coupled to the first circuit;
receiving, by a third input of the electronic device, a reference voltage, the third input coupled to the first circuit; and
receiving, by a fourth input of the electronic device, an authorization voltage, the fourth input coupled to the first circuit via a second input buffer.

14. The method of claim 13, wherein each of the first input buffer and the second input buffer comprises a control input, the method further comprising:
receiving, by each of the first input buffer and the second input buffer, a corresponding control signal having a first value during the first duration and a second value during a remaining duration of the clock signal.

15. The method of claim 14, further comprising generating, by a second circuit, the corresponding control signal, the second circuit having an input coupled to an output of the first input buffer, the second circuit comprising a delay circuit configured to generate a delay for a duration equal to the first duration.

16. The method of claim 15, wherein the second circuit comprises a logic gate having a first input coupled to the output of the first input buffer, and a second input coupled to the output of the first input buffer via the delay circuit, the logic gate being either an AND gate in response to output buffers being synchronized on rising edges or a NOR gate in response to the output buffers being synchronized on falling edges.

17. An electronic device, comprising:
a first input configured to receive a clock signal;
a first input buffer coupled to the first input, the first input buffer comprising a data input coupled to the first input and a control input, the first input buffer configured to maintain, based on a value of a control signal at the control input, a constant output voltage regardless of a value at the data input during a first duration after each edge of the clock signal, the first duration being smaller than half a period of the clock signal;
a first circuit coupled to the first input through the first input buffer;
a plurality of outputs, each output configured to be synchronized on a first edge of the clock signal, each output coupled to the first circuit via a first output buffer;
a second input configured to receive a power supply voltage, the second input coupled to the first circuit; and
a third input configured to receive a reference voltage, the third input coupled to the first circuit.

18. The electronic device of claim 17, further comprising a fourth input configured to receive an authorization voltage, the fourth input coupled to the first circuit via a second input buffer, the second input buffer having a data input and a control input.

19. The electronic device of claim 18, wherein each control input of the first input buffer and the second input buffer is configured to receive a corresponding control signal having a first value during the first duration and a second value during a remaining duration of the clock signal.

20. The electronic device of claim 19, further comprising a second circuit having an input coupled to an output of the first input buffer, the second circuit configured to generate the control signal for the first input buffer, the second circuit comprising:
a delay circuit configured to generate a delay equal to the first duration; and
a logic gate having a first input coupled to the output of the first input buffer, and a second input coupled to the output of the first input buffer via the delay circuit, the logic gate being either an AND gate in response to output buffers being synchronized on rising edges or a NOR gate in response to the output buffers being synchronized on falling edges.

* * * * *